(12) United States Patent
Felderman et al.

(10) Patent No.: US 10,467,275 B2
(45) Date of Patent: Nov. 5, 2019

(54) STORAGE EFFICIENCY

(71) Applicant: International Business Machines Corporation, Armonk, NY (US)

(72) Inventors: Gregory S. Felderman, Broomfield, CO (US); Brian K. Hoyt, Thornton, CO (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 15/374,430

(22) Filed: Dec. 9, 2016

(65) Prior Publication Data

US 2018/0165356 A1 Jun. 14, 2018

(51) Int. Cl.
| | | |
|---|---|---|
| G06F 17/30 | (2006.01) | |
| G06F 16/35 | (2019.01) | |
| G06F 16/83 | (2019.01) | |
| G06F 16/93 | (2019.01) | |
| G06F 16/174 | (2019.01) | |
| G06F 16/84 | (2019.01) | |
| G06F 16/81 | (2019.01) | |

(Continued)

(52) U.S. Cl.
CPC .......... *G06F 16/35* (2019.01); *G06F 16/1744* (2019.01); *G06F 16/83* (2019.01); *G06F 16/93* (2019.01); *G06F 16/258* (2019.01); *G06F 16/81* (2019.01); *G06F 16/84* (2019.01); *H03M 7/30* (2013.01)

(58) Field of Classification Search
CPC ........ G06F 17/30911; G06F 17/30914; G06F 17/30011; G06F 17/30336; G06F 17/30339; G06F 17/30598; G06F 17/3092; G06F 17/30923; G06F 17/2247; G06F 16/81; G06F 16/84; G06F 16/93; G06F 17/227; G06F 16/1744; G06F 16/258; H03M 7/30; H03M 7/707
USPC ....... 707/737, 693, 758, 769, 803, 755, 756, 707/797, 809
See application file for complete search history.

(56) References Cited

U.S. PATENT DOCUMENTS

| | | |
|---|---|---|
| 6,978,419 B1 | 12/2005 | Kantrowitz |
| 6,996,569 B1 | 2/2006 | Bedell et al. |
| 7,509,387 B2 | 3/2009 | Hirsch |

(Continued)

FOREIGN PATENT DOCUMENTS

| | | |
|---|---|---|
| EP | 2416267 A1 | 2/2012 |
| GB | 2414820 A | 12/2005 |

(Continued)

OTHER PUBLICATIONS

IPCOM000213554D, An Intelligent Storage Technique and Method for Optimal Storage of Similar Layout Documents in Content Repositories, Dec. 21, 2011, 4 pages.

(Continued)

*Primary Examiner* — Dangelino N Gortayo
(74) *Attorney, Agent, or Firm* — Farrokh Pourmirzaie; Edell, Shapiro & Finnan, LLC

(57) ABSTRACT

A method, a processing device, and a computer program product are provided. At least two data elements common between multiple documents are combined into a combined group. Instances of the combined group in the multiple documents are replaced with a corresponding identifier. The combined group is stored in a data object separate from the multiple documents.

20 Claims, 9 Drawing Sheets

(51) Int. Cl.
*G06F 16/25* (2019.01)
*H03M 7/30* (2006.01)

(56) References Cited

U.S. PATENT DOCUMENTS

| | | | |
|---|---|---|---|
| 7,593,949 B2 | 9/2009 | Begun et al. | |
| 7,669,120 B2 | 2/2010 | Liao et al. | |
| 7,739,586 B2 | 6/2010 | Suver | |
| 7,752,192 B2 | 7/2010 | Gu et al. | |
| 7,774,311 B2 | 8/2010 | Cox et al. | |
| 7,853,573 B2 | 12/2010 | Warner et al. | |
| 8,015,218 B2 * | 9/2011 | Thienot | H04N 19/25 707/809 |
| 8,099,397 B2 | 1/2012 | Felderman et al. | |
| 8,117,234 B2 | 2/2012 | Parrott | |
| 8,161,023 B2 | 4/2012 | Felderman et al. | |
| 8,788,509 B2 * | 7/2014 | Ruellan | G06F 17/2247 707/737 |
| 8,954,400 B2 | 2/2015 | Brown | |
| 9,390,099 B1 * | 7/2016 | Wang | G06F 16/1744 |
| 2002/0065822 A1 * | 5/2002 | Itani | G06F 17/30914 |
| 2004/0205668 A1 | 10/2004 | Eastlake | |
| 2005/0066190 A1 | 3/2005 | Martin | |
| 2006/0206518 A1 | 9/2006 | Bhatia | |
| 2007/0106689 A1 | 5/2007 | Slater | |
| 2009/0119320 A1 | 5/2009 | Welsh et al. | |
| 2010/0131475 A1 * | 5/2010 | Kataoka | G06F 17/30911 707/693 |
| 2011/0225154 A1 | 9/2011 | Isaacson et al. | |
| 2011/0231619 A1 | 9/2011 | Shalev et al. | |
| 2015/0121199 A1 * | 4/2015 | Wu | G06F 17/2247 715/239 |
| 2015/0293968 A1 | 10/2015 | Dickie | |
| 2017/0083600 A1 | 3/2017 | Felderman | |
| 2017/0116193 A1 | 4/2017 | Felderman | |

FOREIGN PATENT DOCUMENTS

| | | |
|---|---|---|
| GB | 2458371 A | 9/2009 |
| WO | 2010026205 A1 | 3/2010 |
| WO | 2012038742 A1 | 3/2012 |

OTHER PUBLICATIONS

Harold, XML in a Nutshell, 2nd Edition, 2002, 5 pages.

Malysiak-Mrozek, et al; "Data Grouping Process in Extended SQL Language Containing Fuzzy Elements."Man-Machine Interactions. Springer Berlin Heidelberg, 2009. 247-256.

Felderman et al., "Creating Data Objects to Separately Store Common Data Included in Documents", International Business Machines Corporation, Sep. 2015, 30 pages.

Nicola, Matthias, and Bert Van der Linden. "Native XML support in DB2 universal database." Proceedings of the 31st international conference on Very large data bases. VLDB Endowment, 2005.

List of IBM Patents or Patent Applications Treated as Related, Mar. 10, 2017.

* cited by examiner

```xml
<customer>
    <name>Wile E Coyote</name>
    <address>
        <street>213 Desert Drive</street>
        <city>Palm Springs</city>      —— 402
        <state>CA</state>              —— 404    } 418
        <zip>92262</zip>               —— 406
    </address>
    <transaction>
        <name>ACME Corporation</name>  —— 408    } 420
        <store_id>234CO5</store_id>    —— 410
        <date>20150412</date>
        <street>234 W. 45th St.</street> —— 412
        <city>Palm Springs</city>      —— 402
        <state>CA</state>              —— 404    } 418  } 422  } 424
        <zip>92262</zip>               —— 406
        <amount>96.45</amount>         —— 414
    </transaction>
    <transaction>
        <name>ACME Corporation</name>  —— 408    } 420
        <store_id>234CO5</store_id>    —— 410
        <date>20150430</date>
        <street>234 W. 45th St.</street> —— 412
        <city>Palm Springs</city>      —— 402
        <state>CA</state>              —— 404    } 418  } 422
        <zip>92262</zip>               —— 406
        <amount>87.32</amount>
    </transaction>
</customer>
<customer>
    <name>Walter Roadrunner</name>
    <address>
        <street>215 Desert Drive</street>
        <city>Palm Springs</city>      —— 402
        <state>CA</state>              —— 404    } 418
        <zip>92262</zip>               —— 406
    </address>
    <transaction>
        <name>ACME Corporation</name>  —— 408    } 420
        <store_id>234CO5</store_id>    —— 410
        <date>20150413</date>
        <street>234 W. 45th St.</street> —— 412
        <city>Palm Springs</city>      —— 402
        <state>CA</state>              —— 404    } 418  } 422  } 424
        <zip>92262</zip>               —— 406
        <amount>96.45</amount>         —— 414
    </transaction>
</customer>
```

FIG.4

```
<customer>
    <name>Wile E Coyote</name>
    <address>
        <street>213 Desert Drive</street>
        <city>Palm Springs</city>      ——— 402  ⎫
        <state>CA</state>              ——— 404  ⎬ 418
        <zip>92262</zip>               ——— 406  ⎭
    </address>
    <transaction>
        <name>ACME Corporation</name>  ——— 408  ⎫ 420
        <store_id>234CO5</store_id>    ——— 410  ⎭
        <street>234 W. 45th St.</street> ——— 412  ⎫        ⎫
        <city>Palm Springs</city>      ——— 402  ⎫         ⎬ 422 ⎬ 424
        <state>CA</state>              ——— 404  ⎬ 418     ⎭     ⎭
        <zip>92262</zip>               ——— 406  ⎭
        <amount>96.45</amount>         ——— 414
        <date>20150412</date>
    </transaction>
    <transaction>
        <name>ACME Corporation</name>  ——— 408  ⎫ 420
        <store_id>234CO5</store_id>    ——— 410  ⎭
        <street>234 W. 45th St.</street> ——— 412  ⎫
        <city>Palm Springs</city>      ——— 402  ⎫         ⎬ 422
        <state>CA</state>              ——— 404  ⎬ 418     ⎭
        <zip>92262</zip>               ——— 406  ⎭
        <date>20150430</date>
        <amount>87.32</amount>
    </transaction>
</customer>
<customer>
    <name>Walter Roadrunner</name>
    <address>
        <street>215 Desert Drive</street>
        <city>Palm Springs</city>      ——— 402  ⎫
        <state>CA</state>              ——— 404  ⎬ 418
        <zip>92262</zip>               ——— 406  ⎭
    </address>
    <transaction>
        <name>ACME Corporation</name>  ——— 408  ⎫ 420
        <store_id>234CO5</store_id>    ——— 410  ⎭
        <date>20150413</date>
        <street>234 W. 45th St.</street> ——— 412  ⎫        ⎫
        <city>Palm Springs</city>      ——— 402  ⎫         ⎬ 422 ⎬ 424
        <state>CA</state>              ——— 404  ⎬ 418     ⎭     ⎭
        <zip>92262</zip>               ——— 406  ⎭
        <amount>96.45</amount>         ——— 414
        <date>20150413</date>
    </transaction>
</customer>
```

FIG.5

```
<customer>
    <name>Wile E Coyote</name>
    <address>
        <street>213 Desert Drive</street>
        <city>Palm Springs</city>
        <state>CA</state>
        <zip>92262</zip>
    </address>
        <transaction>
        <##1>
        <date>20150412</date>
        </transaction>
        <transaction>
        <##2>
        <date>20150430</date>
        <amount>87.32</amount>
        </transaction>
</customer>
<customer>
    <name>Walter Roadrunner</name>
    <address>
        <street>215 Desert Drive</street>
        <city>Palm Springs</city>
        <state>CA</state>
        <zip>92262</zip>
    </address>
        <transaction>
        <##1>
        <date>20150413</date>
        </transaction>
</customer>
```

FIG.6

```
<customer>
    <name>Wile E Coyote</name>
    <address>
        <street>213 Desert Drive</street>
        <##3>
    </address>
        <transaction>
        <##1>
        <date>20150412</date>
        </transaction>
        <transaction>
        <##2>
        <date>20150430</date>
        <amount>87.32</amount>
        </transaction>
</customer>
<customer>
    <name>Walter Roadrunner</name>
    <address>
        <street>215 Desert Drive</street>
        <##3>
    </address>
        <transaction>
        <##1>
        <date>20150413</date>
        </transaction>
</customer>
```

FIG.7

```xml
<customer>
    <name>Wile E Coyote</name>
    <address>
        <street>213 Desert Drive</street>
        <city>Palm Springs</city>
        <state>CA</state>
        <zip>92262</zip>
    </address>
        <transaction>
        <name>ACME Corporation</name>
        <store_id>234CO5</store_id>
        <street>234 W. 45th St.</street>
        <city>Palm Springs</city>
        <state>CA</state>
        <zip>92262</zip>
        <amount>96.45</amount>
        <date>20150412</date>
        </transaction>
        <transaction>
        <name>ACME Corporation</name>
        <store_id>234CO5</store_id>
        <street>234 W. 45th St.</street>
        <city>Palm Springs</city>
            <state>CA</state>
        <zip>92262</zip>
        <date>20150430</date>
        <amount>87.32</amount>
        </transaction>
</customer>
<customer>
    <name>Walter Roadrunner</name>
    <address>
        <street>215 Desert Drive</street>
        <city>Palm Springs</city>
        <state>CA</state>
        <zip>92262</zip>
    </address>
        <transaction>
        <name>ACME Corporation</name>
        <store_id>234CO5</store_id>
        <street>234 W. 45th St.</street>
        <city>Palm Springs</city>
        <state>CA</state>
        <zip>92262</zip>
        <amount>96.45</amount>
        <date>20150413</date>
        </transaction>
</customer>
```

FIG.9

STORAGE EFFICIENCY

BACKGROUND

Present invention embodiments are related to methods, systems and computer program products for identifying common data across documents, grouping contiguous and non-contiguous common data into a larger resource, and compressing the documents.

Correspondence with customers is critical to operation of any successful company. Much of the correspondence are customer statements. Typically, when a company generates customer statements, customer statements are grouped into a report. A report can contain millions of documents, one for each customer. Much of the information in the customer statements is duplicate information. The duplicate information may be, for example, a company logo, company contact information, or overlays giving the statement structure. The duplicate information can be removed and replaced with an identifier. An enormous amount of storage space may be saved by performing this operation. On retrieval, the identifier in the statement is removed and the duplicate information is reinserted into a customer statement for presentation to a customer. Unfortunately, for small amounts of duplicate information, an identifier could be larger than the duplicate information. Further, logic and processing time for extracting and then replacing small amounts of the duplicate information may be too expensive for an amount of storage saved.

SUMMARY

In a first aspect of various embodiments, a method of storing data by at least one processing device is provided. At least two data elements common between multiple documents are combined into a combined group. Instances of the combined group in the multiple documents are replaced with a corresponding identifier. The combined group is stored in a data object separate from the multiple documents.

In a second aspect of the various embodiments, a system for storing and retrieving data is provided. The system includes at least one processor and at least one memory connected therewith. The at least one memory includes instructions for the at least one processor to configure the system to: combine at least two data elements common between multiple documents into a combined group; replace instances of the combined group in the multiple documents with a corresponding identifier; and store the combined group in a data object separate from the multiple documents.

In a third aspect of the various embodiments, a computer program product is provided. The computer program product includes at least one computer readable storage medium that has computer readable program code embodied therewith for execution on a processing system. The computer readable program code is configured to be executed by the processing system to: combine at least two data elements common between a plurality of documents into a combined group; replace instances of the combined group in the multiple documents with a corresponding identifier; and store the combined group in a data object separate from the multiple documents.

BRIEF DESCRIPTION OF THE DRAWINGS

Generally, like reference numerals in the various figures are utilized to designate like components.

FIG. 4 shows an example eXtensible Markup Language (XML) report in which a <customer> element is a document element.

FIG. 5 shows the example XML report of FIG. 4 with date fields moved to create larger contiguous resources.

FIGS. 6 and 7 show data element groups being replaced with identifiers.

FIG. 9 illustrates the documents of FIG. 4 after the process of FIG. 8 is performed.

DETAILED DESCRIPTION

Figure 1:
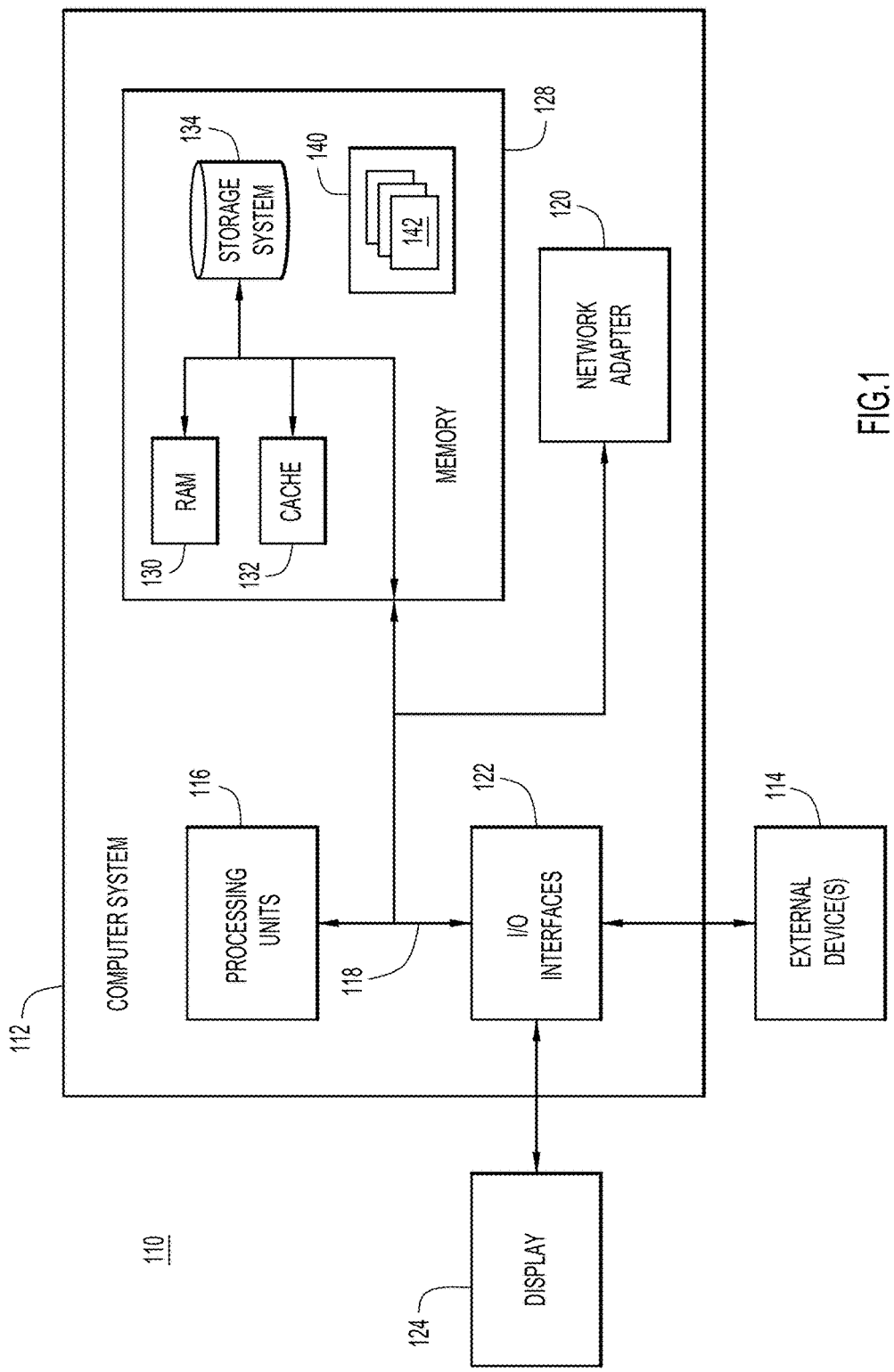
FIG. 1 shows a schematic of an example processing device, which may implement various embodiments of the invention.

FIG. 1 shows a schematic of an example processing device 110, which may implement embodiments of the invention. Processing device 110 is only one example of a suitable processing device for implementing various embodiments and is not intended to suggest any limitation as to the scope of use or functionality of embodiments of the invention described herein. Regardless, processing device 110 is capable of being implemented and/or performing any of the functionality set forth herein.

In processing device 110, there is a computer system 112 which is operational with numerous other general purpose or special purpose computing system environments or configurations. Examples of well-known computing systems, environments, and/or configurations that may be suitable for use with computer system 112 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 112 may be described in the general context of computer system executable instructions, such as program modules, being executed by a computer system. Generally, program modules may include routines, programs, objects, components, logic, data structures, and so on that perform particular tasks or implement particular abstract data types. Computer system 112 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system 112 is shown in the form of a general-purpose computing device. Components of computer system 112 may include, but are not limited to, one or more processors or processing units 116, a system memory 128, and a bus 118 that couples various system components including system memory 128 to one or more processors 116.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 112 typically includes a variety of computer system readable media. Such media may be any available media that is accessible by computer system 112, and includes both volatile and non-volatile media, removable and non-removable media.

System memory 128 can include computer system readable media in the form of volatile memory, such as random access memory (RAM) 130 and/or cache memory 132. Computer system 112 may further include other removable/non-removable, volatile/non-volatile computer system storage media. By way of example only, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 118 by one or more data media interfaces. As will be further depicted and described below, memory 128 may include at least one program product having a set (e.g., at least one) of program modules that are configured to carry out the functions of embodiments of the invention.

Program/utility 140, having a set (at least one) of program modules 142, may be stored in memory 128 by way of example, and not limitation, as well as an operating system, one or more application programs, other program modules, and program data. Each of the operating system, the one or more application programs, the other program modules, and program data or some combination thereof, may include an implementation of a networking environment. Program modules 142 generally carry out the functions and/or methodologies of embodiments of the invention as described herein.

Computer system 112 may also communicate with one or more external devices 114 such as a keyboard, a pointing device, a display 124, etc.; one or more devices that enable a user to interact with computer system 112; and/or any devices (e.g., network card, modem, etc.) that enable computer system 112 to communicate with one or more other computing devices. Such communication can occur via Input/Output (I/O) interfaces 122. Still yet, computer system 112 can communicate with one or more networks such as a local area network (LAN), a general wide area network (WAN), and/or a public network (e.g., the Internet) via network adapter 120. As depicted, network adapter 120 communicates with the other components of computer system 112 via bus 118. It should be understood that, although not shown, other hardware and/or software components could be used in conjunction with computer system 112. Examples, include, but are not limited to: microcode, device drivers, redundant processing units, external disk drive arrays, RAID systems, tape drives, and data archival storage systems, etc.

Figure 2:
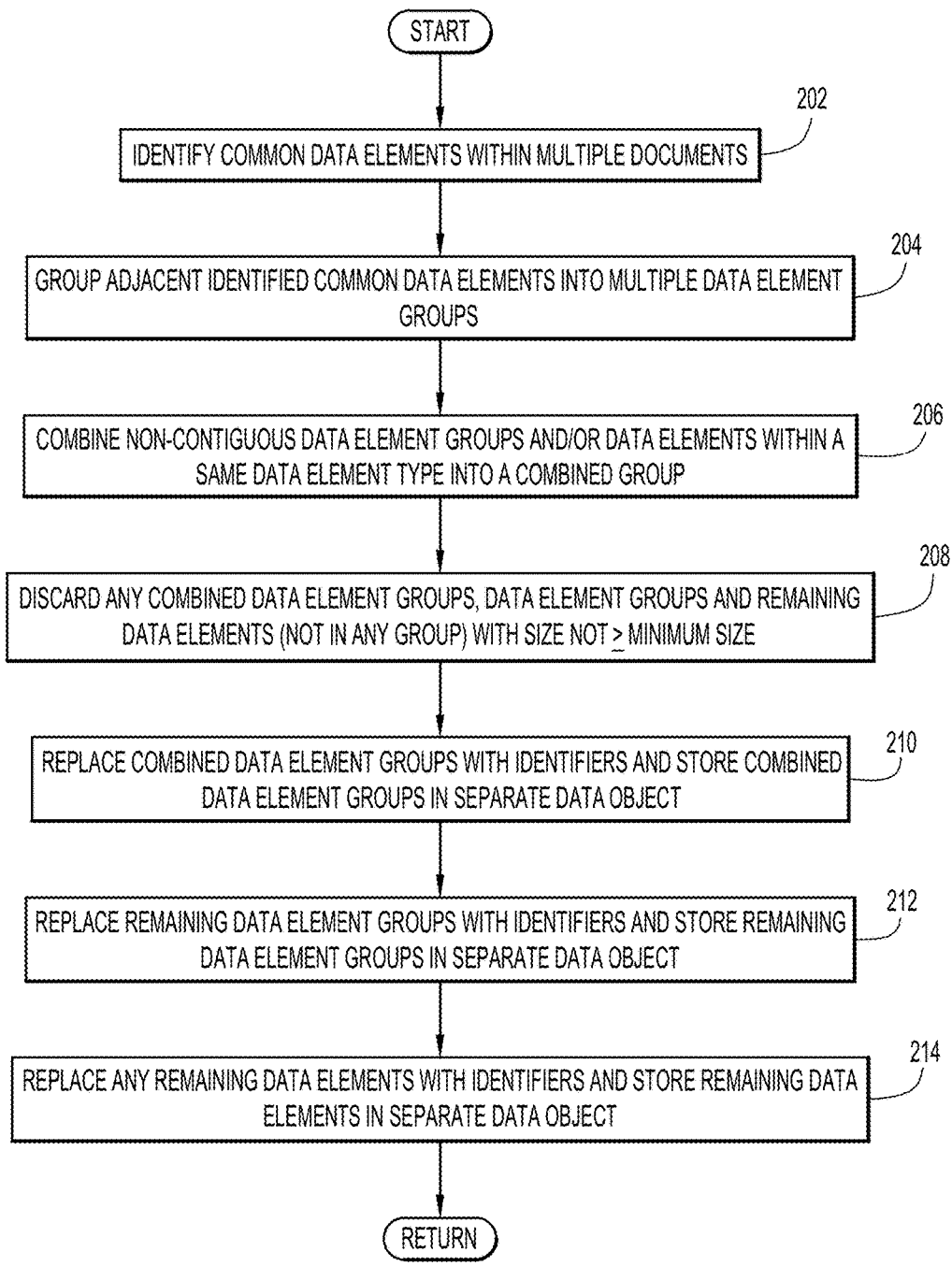
FIG. 2 is a flowchart illustrating an example process for compressing the documents.

FIG. 2 is a flowchart of an example process, which may be performed in various embodiments to compress documents. The process is explained by reference to FIG. 4, which shows an example eXtensible Markup Language (XML) report. In FIG. 4, a <customer> element is a document element or document. Therefore, the XML report includes two documents.

The process may begin by identifying common data elements within multiple documents (act 202). In FIG. 4, the following common data elements are identified:

| Common Data Element | Contents |
| --- | --- |
| 402 | <city>Palm Springs</city> |
| 404 | <state>CA</state> |
| 406 | <zip>92262</zip> |
| 408 | <name>ACME Corporation</name> |
| 410 | <store_id>234CO5</store_id> |
| 412 | <street>234 W. 45th St.</street> |
| 414 | <amount>96.45</amount> |

Next, the process may group adjacent identified common data elements into multiple data element groups (act 204) as shown below. In this specification, a data element group may include one or more identified common data elements.

| Data Element Group | Contents |
| --- | --- |
| 418 (402, 404, 406) | <city>Palm Springs</city><br><state>CA</state><br><zip>92262</zip> |
| 420 (408, 410) | <name>ACME Corporation</name><br><store_id>234CO5</store_id> |
| 422 (412, 402, 404, 406) | <street>234 W. 45th St.<street><br><city>Palm Springs</city><br><state>CA</state><br><zip>92262</zip> |
| 424 (412, 402, 404, 406, 414) | <street>234 W. 45th St.<street><br><city>Palm Springs</city><br><state>CA</state><br><zip>92262</zip><br><amount>96.45</amount> |

Next, the process may combine two or more data element groups into a combined group (act 206) as shown below. In some embodiments, the data element groups to be combined may be moved adjacent to each other. In this specification, a combined group may be broadly defined as one or more data element groups.

Figure 3:
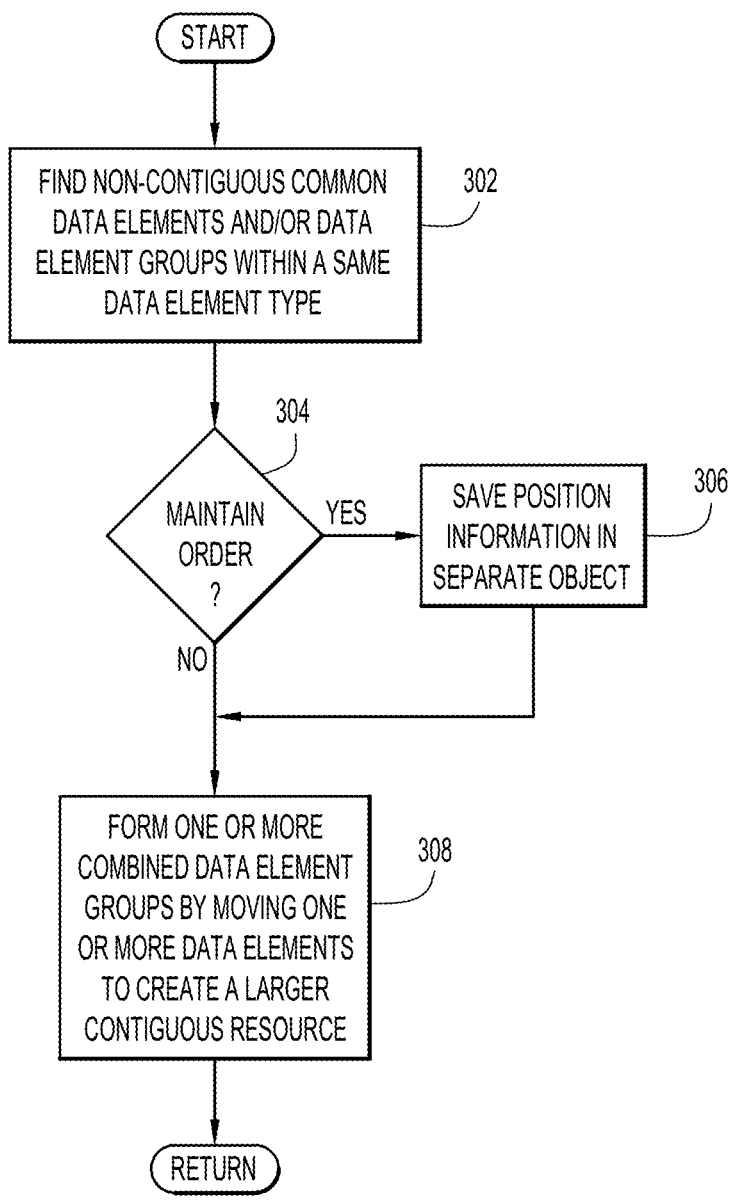
FIG. 3 is a flowchart illustrating, in more detail, an example process for act 206 of FIG. 2.

FIG. 3 is a flowchart of example process 206 in more detail. The process may begin by finding non-contiguous common data elements and/or non-contiguous data element groups within a same data element type (act 302). Upon finding non-contiguous common data elements and/or non-contiguous data element groups within a same data element type, a determination is made regarding whether original position information of data elements of a new data element group should be stored (act 304). In some embodiments, the determination regarding whether original position information is to be stored may be based on whether the data elements of the new data element group are associated with an order indicated by a document schema. If the original position information is to be stored, then the original position information is stored in the separate object (act 306).

After storing the position information, in act 306, or after determining that the original position information is not to be saved, in act 304, one or more combined data element groups may be formed by moving one or more data elements to create a larger contiguous resource (act 308). The following table shows two combined data element groups formed from data element groups of FIG. 4. As shown in the table below, data element groups 420 and 424 may be combined to form a first combined data element group and data element groups 420 and 422 may be combined to form a second combined data element group.

| Combined Data Element Groups | Contents |
|---|---|
| (420, 424) | <name>ACME Corporation</name><br><store_id>234CO5</store_id><br><city>Palm Springs</city><br><state>CA</state><br><zip>92262</zip><br><amount>96.45</amount> |
| (420, 422) | <name>ACME Corporation</name><br><store_id>234CO5</store_id><br><city>Palm Springs</city><br><state>CA</state><br><zip>92262</zip> |

As shown in FIG. 5, a first transaction in a first customer element and a first transaction in a second customer element may become as follows:

```
<transaction>
<name>ACME Corporation</name>
<store_id>234CO5</store_id>
<street>234 W. 45th St.</street>
<city>Palm Springs</city>
<zip>92262</zip>
<amount>96.45</amount>
<date>20150412</date>
</transaction>
```

The second transaction in the first customer element may become as follows:

```
<transaction>
<name>ACME Corporation</name>
<store_id>234CO5</store_id>
<street>234 W. 45th St.</street>
<city>Palm Springs</city>
<zip>92262</zip>
<date>20150430</date>
<amount>87.32</amount>
</transaction>
```

Note that the date fields are moved in the first transaction of the first customer element, the first transaction in the second customer element, and the second transaction of the first customer element in order to create larger contiguous resources.

Returning to FIG. 2, the process may discard any data element not in any group or data element group (combined or not combined) that is not greater than or equal to a minimum size, which may be configurable (act 208). With respect to the example of FIG. 4, we assume that none of the data element groups has a size that is not greater than or equal to the minimum size.

Next, the process may replace instances of combined data element groups with identifiers and may store the combined data element groups in a separate data object (act 210). FIG. 6 shows combined data element group (420, 424) replaced by identifier <##1> and combined data element group (420, 422) replaced by identifier <##2>.

Remaining data element groups may then be replaced with identifiers and stored in the separate data object (act 212). As shown in FIG. 7, data element group 418 is replaced with identifier <##3>.

Any remaining data elements may then be replaced with identifiers and stored in the separate data object (act 214). As can be seen in FIG. 6, no data element groups remain. The documents may be further compressed by using a conventional document compressor.

Figure 8:
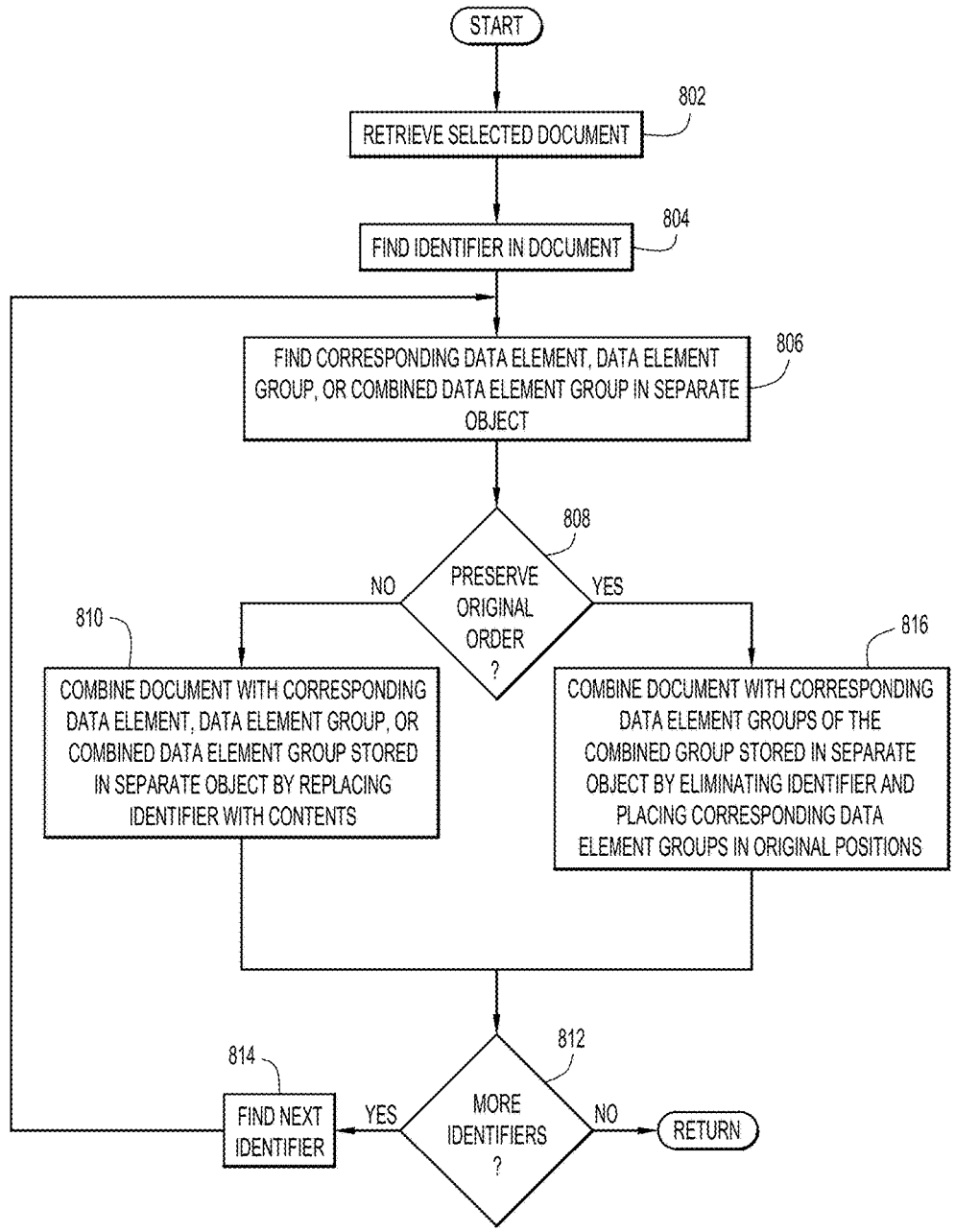
FIG. 8 shows a flowchart of an example process for retrieving and decompressing a selected document.

FIG. 8 illustrates an example process for retrieving and decompressing a selected document. If the selected document was also compressed using the conventional document compressor, the process of FIG. 8 assumes that the retrieved selected document was already decompressed by a conventional document decompressor.

The process may begin with retrieving (and possibly decompressing via the conventional document decompressor) a selected document (act 802). The process may then find a first identifier in the retrieved document (act 804) and a corresponding data element, data element group, or combined data element group in the separate object (act 806). A determination may then be made regarding whether the corresponding data element, data element group, or combined data element group is to have its original order preserved (act 808). Whether the original order is to be preserved may be determined based on whether original position information is stored in the separate object for the corresponding data element, data element group, or combined data element group.

If, during act 808, the determination is made that the original order is not to be preserved, then respective identifiers in the selected document may be replaced with contents of the corresponding data element, data element group, or combined data element group stored in the separate object (act 810).

If, during act 808, a determination is made that the original order is to be preserved, then respective identifiers in the selected document may be replaced with the contents of the corresponding data element groups of the combined data element group stored in the separate object based on the stored position of each of the data elements of each of the data element groups of the combined data element group (act 816).

After performing either act 810 or act 816, the process may determine whether there are any additional identifiers in the selected document (act 812). If there are no additional identifiers, then the process is completed. Otherwise, a next identifier is found (act 814) and acts 806-816 may be repeated.

FIG. 9 shows the documents of FIG. 4 after the process of FIG. 8 is completed. Note that the date field of the first transaction in the first customer element, the date field of the second transaction in the first customer element, and the date field in the transaction of the second customer element are in different positions when compared to FIG. 4. However, because position is not relevant within an element in the example of FIG. 4, the documents of FIG. 9 are equivalent to those of FIG. 4.

The environment of the present invention embodiments may include any number of computer or other processing systems (e.g., client or end-user systems, server systems, etc.) and databases or other repositories arranged in any desired fashion, where the present invention embodiments may be applied to any desired type of computing environment (e.g., cloud computing, client-server, network computing, mainframe, stand-alone systems, etc.). The computer or other processing systems employed by the present invention embodiments may be implemented by any number of any personal or other type of computer or processing system (e.g., desktop, laptop, PDA, mobile devices, etc.), and may include any commercially available operating system and any combination of commercially available and custom software (e.g., browser software, communications software, server software, etc.). These systems may include any types of monitors and input devices (e.g., keyboard, mouse, voice recognition, etc.) to enter and/or view information.

It is to be understood that the software of the present invention embodiments may be implemented in any desired computer language and could be developed by one of ordinary skill in the computer arts based on the functional descriptions contained in the specification and flowcharts illustrated in the drawings. Further, any references herein of software performing various functions generally refer to computer systems or processors performing those functions under software control. The computer systems of the present invention embodiments may alternatively be implemented by any type of hardware and/or other processing circuitry.

The various functions of the computer or other processing systems may be distributed in any manner among any number of software and/or hardware modules or units, processing or computer systems and/or circuitry, where the computer or processing systems may be disposed locally or remotely of each other and may communicate via any suitable communications medium (e.g., LAN, WAN, Intranet, Internet, hardwired, modem connection, wireless, etc.). For example, the functions of the present invention embodiments may be distributed in any manner among the various systems, and/or any other intermediary processing devices. The software and/or algorithms described above and illustrated in the flowcharts may be modified in any manner that accomplishes the functions described herein. In addition, the functions in the flowcharts or description may be performed in any order that accomplishes a desired operation.

The software of the present invention embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, WAN, Internet, Intranet, VPN, etc.). The computer or other processing systems of the present invention embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, Intranet, etc.).

The system may employ any number of any conventional or other databases, data stores or storage structures (e.g., files, databases, data structures, data or other repositories, etc.) to store information. The database system may be implemented by any number of any conventional or other databases, data stores or storage structures (e.g., files, databases, data structures, data or other repositories, etc.) to store information. The database system may be included within or coupled to a server and/or client systems. The database systems and/or storage structures may be remote from or local to the computer or other processing systems, and may store any desired data.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

We claim as our invention:

1. A method of compressing a plurality of documents by at least one processing device, the method comprising:
   identifying, by the at least one processing device, common data elements within the plurality of documents, each data element including a start tag, an end tag, and an element content disposed there between;
   compressing, by the at least one processor, the plurality of documents to form a plurality of compressed documents, the compressing comprising:
      combining groups of at least two of the common data elements that are adjacent into a plurality of combined groups, each combined group of the plurality of combined groups having a size greater than or equal to a configurable minimum size,
      replacing instances of the each combined group of the plurality of combined groups in the plurality of documents with a corresponding identifier, and
      storing the plurality of combined groups in a data object separate from the plurality of documents.

2. The method of claim 1, further comprising:
   storing, by the at least one processor, an original position of data elements of at least one combined group of the plurality of combined groups in the data object.

3. The method of claim 1, further comprising:
   in response to retrieving a compressed document of the plurality of compressed documents, performing, by the at least one processor:
      finding instances of the corresponding identifiers in the retrieved compressed document,
      finding each combined group of the plurality of combined groups, corresponding to a respective found instance of the identifier, in the data object, and replacing the found instances of each of the identifiers with data elements in a corresponding combined group of the plurality of combined groups.

4. The method of claim 3, further comprising:
storing, by the at least one processor, an original position of data elements of at least one combined group of the plurality of combined groups in the data object, wherein
the replacing of the found instances of each of the identifiers is based on the stored original position of the data elements of the at least one combined group.

5. The method of claim 1, wherein at least one of the plurality of documents includes an XML document.

6. The method of claim 1, wherein
at least one combined group of the plurality of combined groups includes data elements associated with an order indicated by a document schema.

7. The method of claim 1, further comprising:
finding, by the at least one processor, at least one common data element and at least one combined group within a same data element type, the at least one common data element and the at least one combined group being non-contiguous with respect to each other; and
moving, by the at least one processor, the at least one common data element to create one or more contiguous resources from the at least one common data element and the at least one combined group, the one or more contiguous resources being one or more new combined groups.

8. A system for storing and retrieving data, the system comprising:
at least one processor; and
at least one memory connected to the at least one processor, the at least one memory including instructions for the at least one processor to configure the system to:
identify common data elements within a plurality of documents, each data element including a start tag, an end tag, and an element content disposed there between;
compress the plurality of documents to form a plurality of compressed documents, the compressing comprising:
combine groups of at least two of the common data elements that are adjacent into a plurality of combined groups, each combined group of the plurality of combined groups having a size greater than or equal to a configurable minimum size,
replace instances of the each combined group of the plurality of combined groups in the plurality of documents with a corresponding identifier, and
store the plurality of combined groups in a data object separate from the plurality of documents.

9. The system of claim 8, wherein the at least one memory further includes instructions for the at least one processor to configure the system to:
store an original position of data elements of at least one combined group of the plurality of combined groups in the data object.

10. The system of claim 8, wherein the at least one memory further includes instructions for the at least one processor to configure the system to:
in response to retrieving a compressed document of the plurality of compressed documents:
find instances of the corresponding identifiers in the retrieved compressed document,
find each combined group of the plurality of combined groups, corresponding to a respective found instance of the identifier, in the data object, and
replace the found instances of each of the identifiers with data elements in a corresponding combined group of the plurality of combined groups.

11. The system of claim 10, wherein the at least one memory further includes instructions for the at least one processor to configure the system to:
store an original position of data elements of at least one combined group of the plurality of combined groups in the data object, wherein
the replacing of the found instances of each of the identifiers is based on the stored original position of the data elements of the at least one combined group.

12. The system of claim 8, wherein at least one of the plurality of documents includes an XML document.

13. The system of claim 8, wherein
at least one combined group of the plurality of combined groups includes data elements associated with an order indicated by a document schema.

14. The system of claim 8, wherein the at least one memory further includes instructions for the at least one processor to configure the system to:
find at least one common data element and at least one combined group within a same data element type, the at least one common data element and the at least one combined group being non-contiguous with respect to each other; and
move the at least one common data element to create one or more contiguous resources from the at least one common data element and the at least one combined group, the one or more contiguous resources being one or more new combined groups.

15. A computer program product comprising:
at least one computer readable storage medium having computer readable program code embodied therewith for execution on a processing system, the computer readable program code being configured to be executed by the processing system to:
identify common data elements within a plurality of documents, each data element including a start tag, an end tag, and an element content disposed there between;
compress the plurality of documents to form a plurality of compressed documents, the compressing comprising
combine groups of at least two of the common data elements that are adjacent into a plurality of combined groups, each combined group of the plurality of combined groups having a size greater than or equal to a configurable minimum size,
replace instances of the each combined group of the plurality of combined groups in the plurality of documents with a corresponding identifier, and
store the plurality of combined groups in a data object separate from the plurality of documents.

16. The computer program product of claim 15, wherein the computer readable program code is further configured to be executed by the processing system to:
store an original position of data elements of at least one combined group of the plurality of combined groups in the data object.

17. The computer program product of claim 15, wherein the computer readable program code is further configured to be executed by the processing system to:

in response to retrieving a compressed document of the plurality of compressed documents:
find instances of the corresponding identifiers in the retrieved compressed document,
find each combined group of the plurality of combined groups, corresponding to a respective found instance of the identifier, in the data object, and
replace the found instances of each of the identifiers with data elements in a corresponding combined group of the plurality of combined groups.

18. The computer program product of claim 17, wherein the computer readable program code is further configured to be executed by the processing system to:
store an original position of data elements of at least one combined group of the plurality of combined groups in the data object, wherein
the replacing of the found instances of each of the identifiers is based on the stored original position of the data elements of the at least one combined group.

19. The computer program product of claim 15, wherein at least one of the plurality of documents includes an XML document.

20. The computer program product of claim 15, wherein at least one combined group of the plurality of combined groups includes data elements associated with an order indicated by a document schema.

\* \* \* \* \*